United States Patent
Hsieh

(10) Patent No.: US 11,004,969 B2
(45) Date of Patent: May 11, 2021

(54) TRENCH MOSFETS HAVING DUMMY CELLS FOR AVALANCHE CAPABILITY IMPROVEMENT

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipeti (TW)

( * ) Notice: Subject to any disclaimer, the term of this patent is extended or adjusted under 35 U.S.C. 154(b) by 0 days.

(21) Appl. No.: 16/594,133

(22) Filed: Oct. 7, 2019

(65) Prior Publication Data
US 2021/0104624 A1 Apr. 8, 2021

(51) Int. Cl.
H01L 29/78 (2006.01)
H01L 29/40 (2006.01)
H01L 29/788 (2006.01)

(52) U.S. Cl.
CPC ........ H01L 29/7813 (2013.01); H01L 29/407 (2013.01); H01L 29/7889 (2013.01)

(58) Field of Classification Search
CPC .................................................. H01L 29/7813
See application file for complete search history.

(56) References Cited

U.S. PATENT DOCUMENTS

| | | | |
|---|---|---|---|
| 8,487,372 B1 | 7/2013 | Hsieh | |
| 8,519,477 B2 | 8/2013 | Hsieh | |
| 2009/0315080 A1* | 12/2009 | Stribley | H01L 27/0705 257/208 |
| 2012/0261737 A1* | 10/2012 | Hsieh | H01L 29/0619 257/315 |
| 2013/0001683 A1* | 1/2013 | Pan | H01L 29/7813 257/334 |
| 2013/0020635 A1* | 1/2013 | Yilmaz | H01L 27/088 257/334 |
| 2014/0091381 A1* | 4/2014 | Lee | H01L 27/0688 257/314 |
| 2014/0264537 A1* | 9/2014 | Sakamoto | H01L 29/7881 257/316 |
| 2016/0013265 A1* | 1/2016 | Yilmaz | H01L 29/7813 257/192 |
| 2017/0018547 A1* | 1/2017 | Naito | H01L 27/0664 |
| 2018/0083101 A1* | 3/2018 | Kudo | H01L 29/78 |

* cited by examiner

*Primary Examiner* — William A Harriston
(74) *Attorney, Agent, or Firm* — Bacon & Thomas, PLLC

(57) ABSTRACT

A trench MOSFET layout with multiple trenched floating gates and at least one trenched channel stop gate in termination area shorted with drain region is disclosed to make it feasibly achieved after die sawing. The layout consisted of multiple trench MOSFETs connected together with multiple sawing trenched gates across a space between two trench MOSFETs having a width same as scribe line. Dummy cells formed between an edge trench and active area act as buffer cells to absorb avalanche energy when gate bias is increasing for turning on channel, therefore, the UIS failure issue is avoided and the avalanche capability of the trench MOSFET is enhanced.

18 Claims, 14 Drawing Sheets

TRENCH MOSFETS HAVING DUMMY CELLS FOR AVALANCHE CAPABILITY IMPROVEMENT

FIELD OF THE INVENTION

This invention relates generally to the cell structure, layout and device configuration of power semiconductor devices. More particularly, this invention relates to a novel and improved cell structure, layout and device configuration for fabricating trench MOSFET (Metal Oxide Semiconductor Field Effect Transistor) having dummy cells without having source regions for avalanche capability improvement.

BACKGROUND OF THE INVENTION

In U.S. Pat. Nos. 8,519,477 and 8,487,372, trench MOSFETs were disclosed having body and source regions between trench gates in active area (as shown in FIG. 1A), multiple floating trench gates (FTG) and channel stop trench gates (CSTG) surrounding the active area in termination area and sawing trench gates (SWTG) across scribe line area (as shown in FIG. 1B and FIG. 1C). The prior arts structures in termination area are used to avoid channeling between drain and source.

FIG. 1E is a top view of the trench MOSFETs of the prior arts. After the UIS (Unclamped Inductance Switching) test, failed sites always occur near an edge of the active area of the trench MOSFET, as shown in FIG. 1E, which is resulted from the turning on of the parasitic bipolar transistor, as illustrated in FIG. 1D (U.S. patent Ser. No. 08/680,610). The trenched gates in an edge trench (as illustrated in FIG. 1E) near the edge of the active area are turned on first when bias voltage on a gate metal runner is increasing for turning on a channel region, resulting in the parasitic bipolar transistor turning on first near the edge of the active area, thus weakening the avalanche capability of the trench MOSFET.

Therefore, there is still a need in the art of the semiconductor device and design and fabrication, particularly for trench MOSFET design and fabrication, to provide a novel cell structure, device configuration that would resolve the difficulties mentioned above. Specifically, it would be desirable to provide a new and improved device configuration to enhance the avalanche capability of semiconductor power devices.

SUMMARY OF THE INVENTION

The present invention relates to an improved device configuration having dummy cells without having source regions surrounding trenched source-body contacts, around edge of an active area to enhance the avalanche capability of semiconductor devices.

According to one aspect, the present invention features a semiconductor power device layout consisted of multiple trench MOSFETs with each comprises: multiple trenched floating gates formed in parallel in a termination area around outside of an active area, the multiple trenched floating gates all have floating voltage and are surrounded by body regions without having source regions whereon, the multiple trenched floating gates all have trench depth equal to or deeper than junction depth of the body regions; at least one trenched channel stop gate formed in the termination area and around outside of the multiple floating trenched gates, each the trenched channel stop gate is connected to at least one sawing trenched gate which is extended across over a space between adjacent trench MOSFETs and connected with the trenched channel stop gate of the adjacent trench MOSFETs; at least one dummy cell formed between an edge trench and the active area, having the body region and the trenched source-body contact but without having the source region.

According to another aspect, the invention also features a trench MOSFET comprises: an epitaxial layer of a first conductivity type grown onto a substrate of the first conductivity type; a plurality of the source regions of the first conductivity type formed near top surface of the epitaxial layer only in the active area, and the source regions is connected to a source metal pad; a plurality of first type body regions of a second conductivity type formed underneath the source regions in the active area; a plurality of second type body regions formed in the epitaxial layer around outside of the active area including the termination area, wherein the source regions is not disposed on top of the second type body regions; a plurality of first type trenched gates in the active area, surrounded by the source regions and the body regions; at least one second type trenched gate surrounded by the second type body regions and extending to the first type trenched gates for gate contact, wherein the at least one second type trenched gate is connected to a gate metal pad for wire bonding.

According to another aspect, the invention also features a trench MOSFET comprises: a substrate of a first conductivity type; an epitaxial layer of the first conductivity type grown on the substrate and having a lower doping concentration than the substrate; a plurality of source regions of the first conductivity type formed near top surface of the epitaxial layer only within the active area: a plurality of first type body regions of a second conductivity type formed underneath the source regions in the active area; a plurality of second type body regions of a second conductivity type formed in the epitaxial layer from top surface of the epitaxial layer around outside of the active area including the termination area; the source regions are not disposed in the top of the second type body regions; a plurality of shielded trenched gates having dual gate electrodes in the active area, each comprises a gate electrode disposed in upper portion and a shielded electrode disposed in the lower portion, wherein the gate electrode and the shielded electrode are insulated from each other by an inter-electrode-insulation layer: the gate electrode in the shielded trenched gate is connected to a gate metal formed over the insulation layer and the shielded electrode in the shielded trenched gates is connected to a source metal formed over the insulation layer; each the shielded trenched gate in the active area further comprises a first type gate oxide layer surrounding bottom and sidewalls of the shielded electrode, and a second type gate oxide along sidewalls of the gate electrode: and a drain metal is on rear side of the substrate.

Preferred embodiments include one or more of the following features: the space between two adjacent trench MOSFETS of the multiple trench MOSFETs has a width same as scribe line: the trenched channel stop gate and the sawing trenched gate of each of the multiple trench MOSFETs are shorted with a drain region of the multiple trench MOSFETs after die sawing through the sawing trenched gate for separation of the multiple trench MOSFETs the body region in the dummy cells adjacent to edge of the active area are connected to the source metal pad; there is only one trenched channel stop gate formed in each of the multiple trench MOSFETs and connected to at least one sawing trenched gate: each of the multiple floating trenched gates in the termination area comprises a single shielded electrode having same conductive material as the shielded electrode in the shielded trenched gates in the active area, padded by the first type gate oxide layer; each of the floating trenched gates in the termination area has the dual gate electrodes same as in active area; the multiple floating trenched gates in the termination have combination structure of a single shielded electrode padded by the first type gate oxide layer, and the dual gate electrodes same as in the active area; the channel stop trenched gate has a single shielded electrode padded by the first type gate oxide layer; the channel stop trenched gate has the dual gate electrodes same as in active area: the sawing trenched gate has a single shielded electrode padded by the first type gate oxide layer; the sawing trenched gate has the dual gate electrodes same as in active area; the multiple floating trenched gates in the termination area have same trench width and depth as the shielded trenched gates in the active area; alternatively the multiple floating trenched gates in the termination area have greater trench width and depth than the shielded trenched gates in the active area; the first type gate oxide has oxide thickness greater than the second type gate oxide; when the first conductivity type is N type and the second conductivity type is P type; when first conductivity type is P type and the second conductivity type is N type; each source region in the active area has uniform doping concentration and junction depth along the top surface of the epitaxial layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front" "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
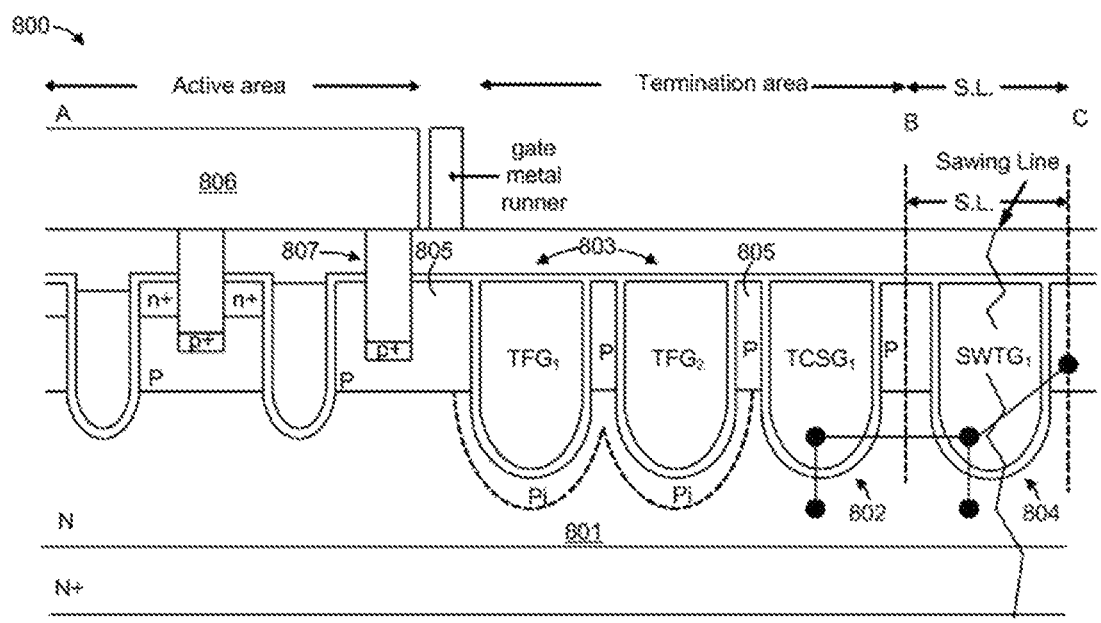
FIG. 1A is a cross-sectional view of a trench MOSFET of a prior art.
Figure 1B:
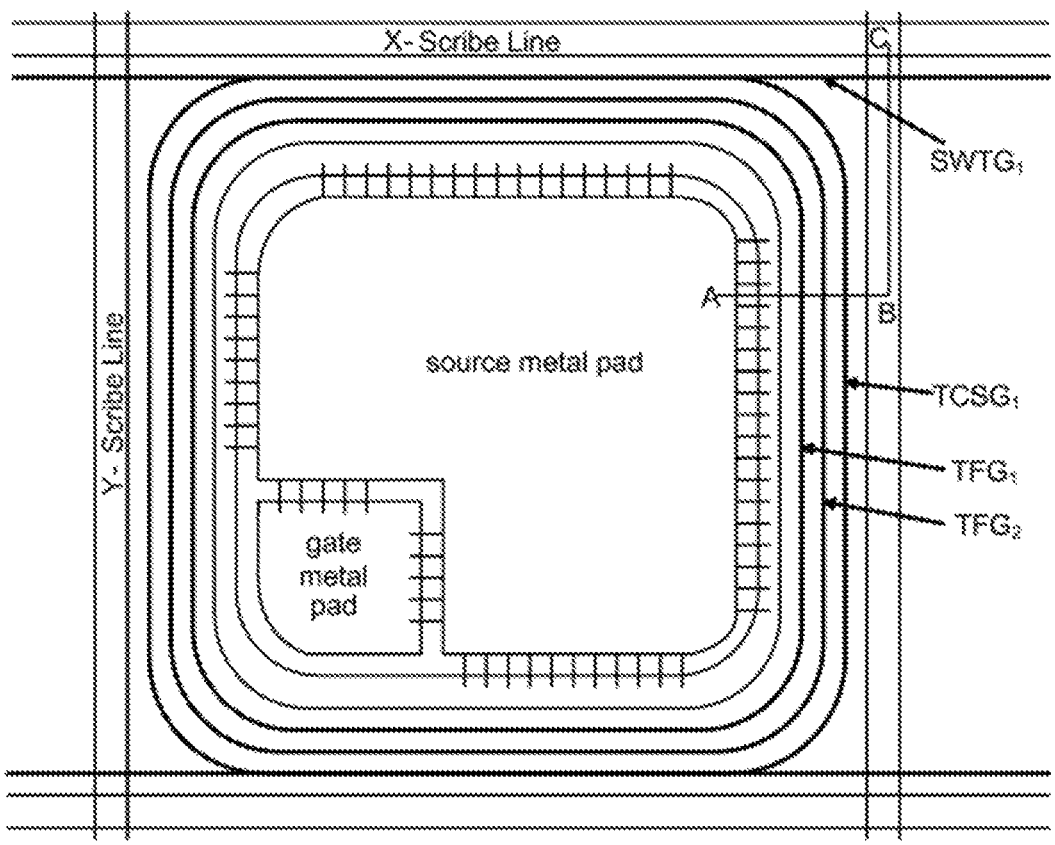
FIG. 1B is a top view of the trench MOSFET in FIG. 1A.
Figure 1C:
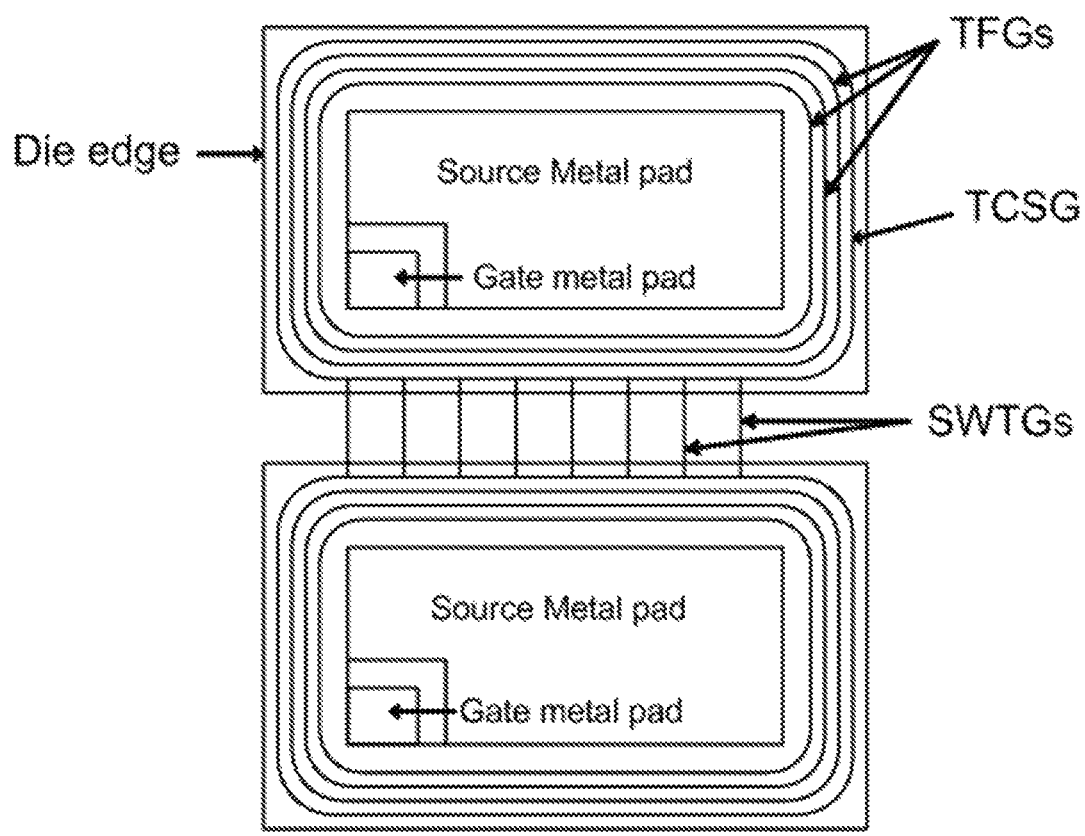
FIG. 1C is a dual-dies layout of a trench MOSFET of another prior art.
Figure 1D:
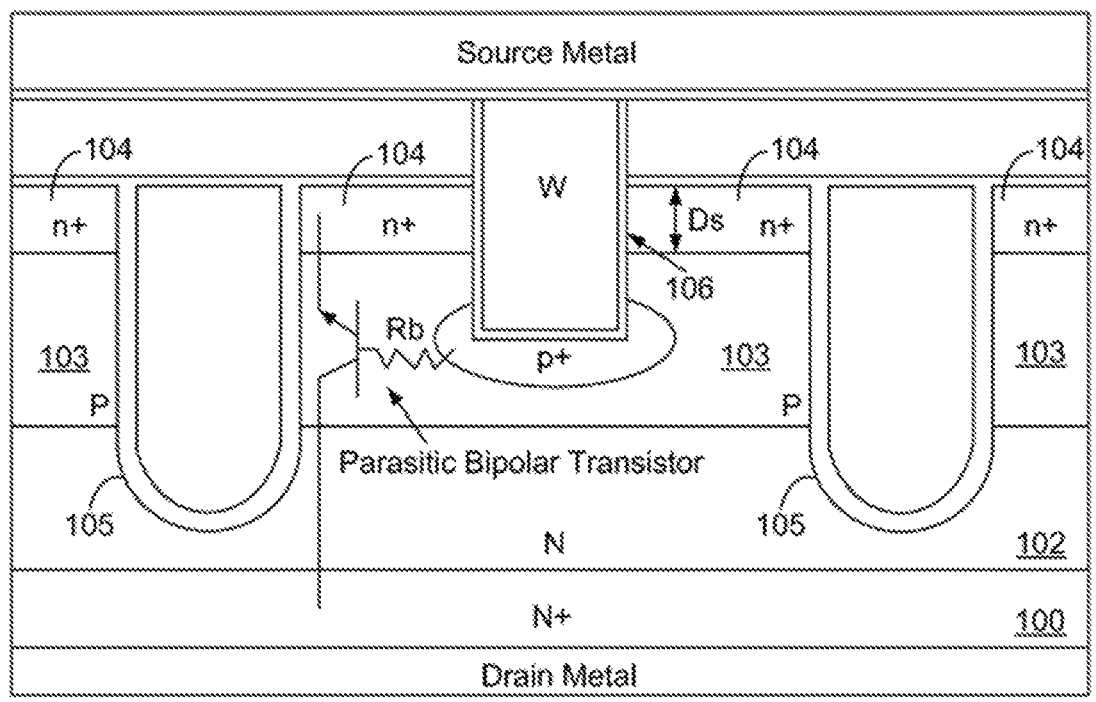
FIG. 1D is a side cross-sectional view of a trench MOSFET of the prior arts.
Figure 1E:
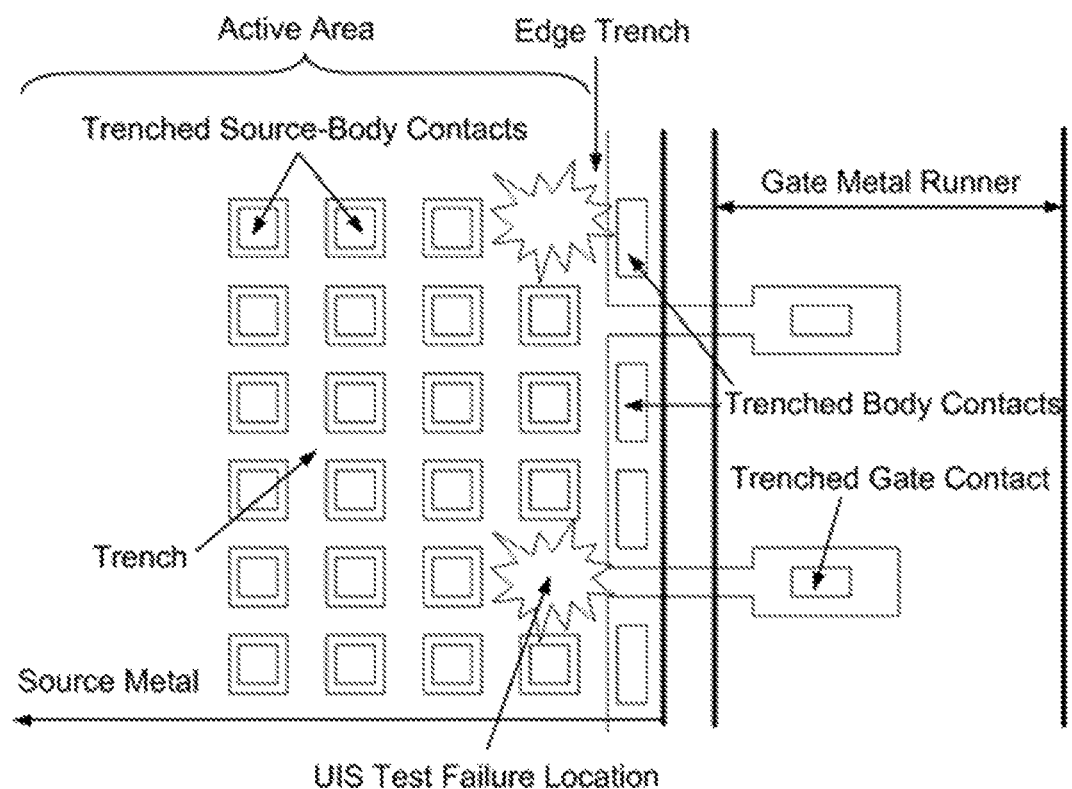
FIG. 1E is a top view of a device structure for showing the disadvantage of the prior arts.
Figure 2A:
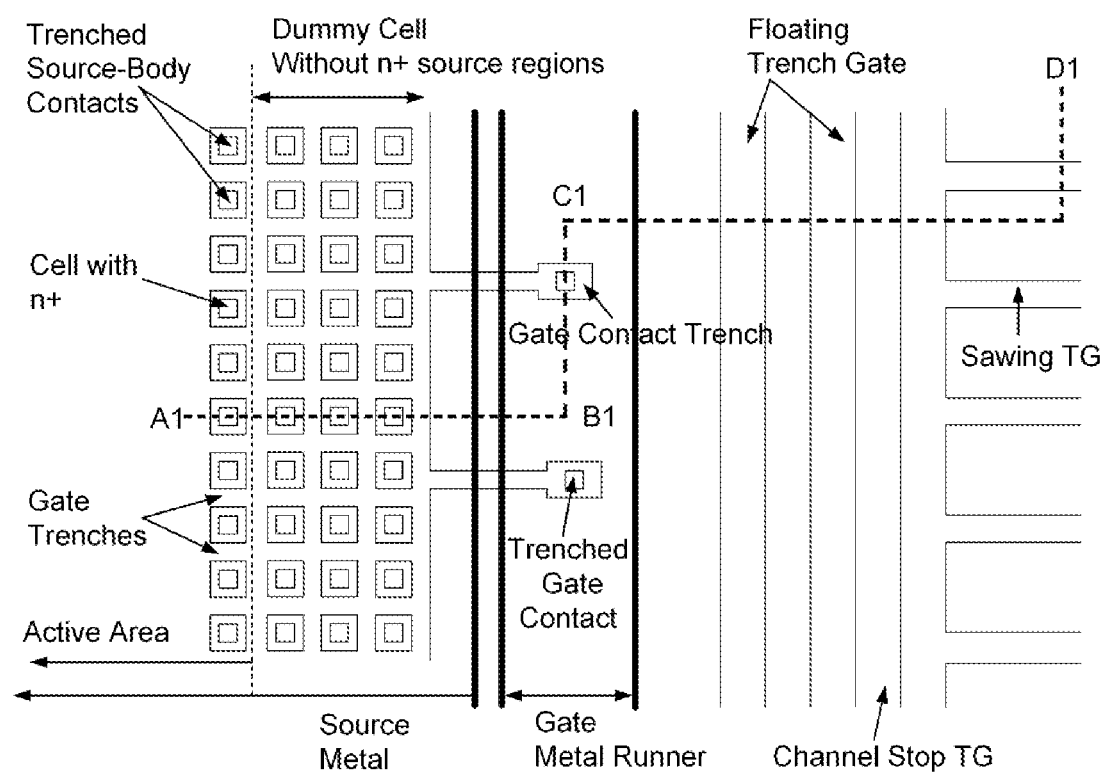
FIG. 2A is a top view of a preferred embodiment according to the present invention.

FIG. 2A is a top view of a preferred embodiment showing a source metal area, a gate metal runner area and a termination area of a trench semiconductor power MOSFET, wherein a plurality of dummy cells without n+ source regions are formed around edge of the active area which has a plurality of transistor cells with n+ regions, wherein both the dummy cells and the transistor cells are square closed cells. In some other embodiments, the transistor cells can be implemented by rectangular closed cells. Trenched source-body contacts in the active area are connected to the source metal, and trenched gate contacts are connected to the gate metal runner for gate connection. The trench semiconductor power MOSFET further comprises multiple floating trenched gates (FTG), the channel stop gates (CSTG) and sawing TG(SWTG) in the termination area. Please refer to FIG. 2A for a preferred embodiment of this invention.

Figure 2B:
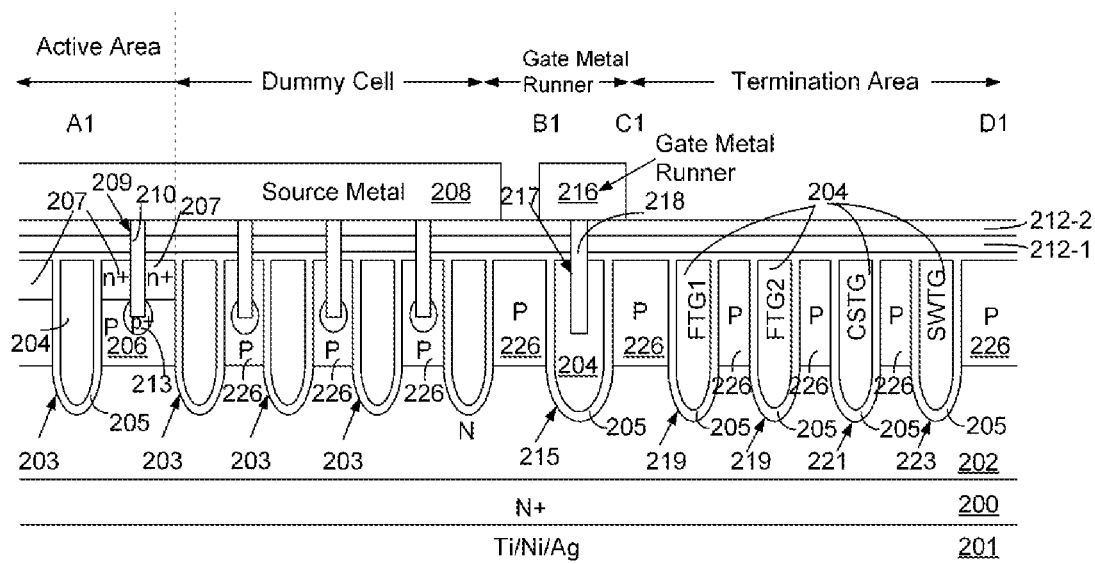
FIG. 2B is a cross-sectional view of the preferred embodiment shown in FIG. 2A

FIG. 2B is a side cross-sectional view showing the A1-B1-C1-D1 cross section in FIG. 2A. The N-channel trench semiconductor power MOSFET is formed on an N+ substrate 200 coated with a back metal of Ti/Ni/Ag on rear side as a drain metal 201. Onto the N+ substrate 200, a lighter doped N epitaxial layer 202 is grown, and a plurality of first type trenched gates 203 are formed comprising a doped poly-silicon layer 204 padded by a first insulation layer 205 as a gate oxide. The gate oxide is a single gate oxide having a thickness along trench sidewalls equal to or greater than a trench bottom. Alternatively, the gate oxide is a double gate oxide (not shown) having a thickness along the trench sidewalls less than the trench bottom. The source regions 207 flanking the first type trenched gates 203 are formed near a top surface of a first type P body region 206 encompassed in the N epitaxial layer 202, and are connected to a source metal 208 composed of Al alloys or Cu alloys through a trenched source-body contact 209, which is comprising a contact metal plug, for example, a W (tungsten) plug 210 padded by a barrier metal layer of Ti/TiN or Co/TiN, and penetrating through a second insulation layer, the n+ source regions 207 and extending into the P body region 206 between a pair of the adjacent first type trenched gates 203, wherein the second insulation layer is functioning as a contact interlayer and comprising a layer of un-doped oxide 212-1 and a layer of BPSG or PSG 212-2. A p+ body contact region 213 having a higher doping concentration than the first P body region 206 is formed under the n+ source region 207 and surrounding at least bottom of the trenched source-body contact 209 to reduce the contact resistance between the W plug 210 and the first P body region 206. The trench semiconductor power MOSFET further comprises at least one second type trenched gate 215 comprising the doped poly-silicon layer 204 padded by the first insulation layer 205, wherein the doped poly-silicon layer 204 in the second type trenched gate 215 is connected to the gate metal runner 216 through a trenched gate contact 217 filled with a W plug 218, which is the same as the W plug 210, for gate connection. Multiple dummy cells are formed around edge of the active area to enhance the avalanche capability of semiconductor devices, having the second type P body regions 226 but without having the n+ source region surrounding trenched body contacts. The trench semiconductor power MOSFET further comprises a plurality of another trenched gates 219, 221 and 223 as multiple FTC CSTG and SWTG in the termination area, comprising the doped poly-silicon layer 204 padded by the first insulation layer 205 surrounded by the second P body regions 226 without having the source region between two adjacent gates in the termination area, wherein each trench depth of the third type trenched gates 219, 221 and 223 is equal to or deeper than a junction depth of the second P body region 226, and each trench width of the trenched gates 219, 221 and 223 is equal to or wider than the first type trenched gate 203.

Figure 3A:
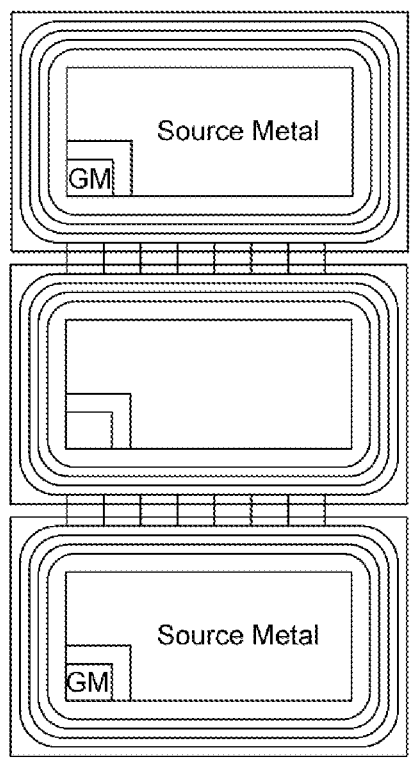
FIG. 3A is a dual dies layout of a preferred embodiment according to the present invention.
Figure 3B:
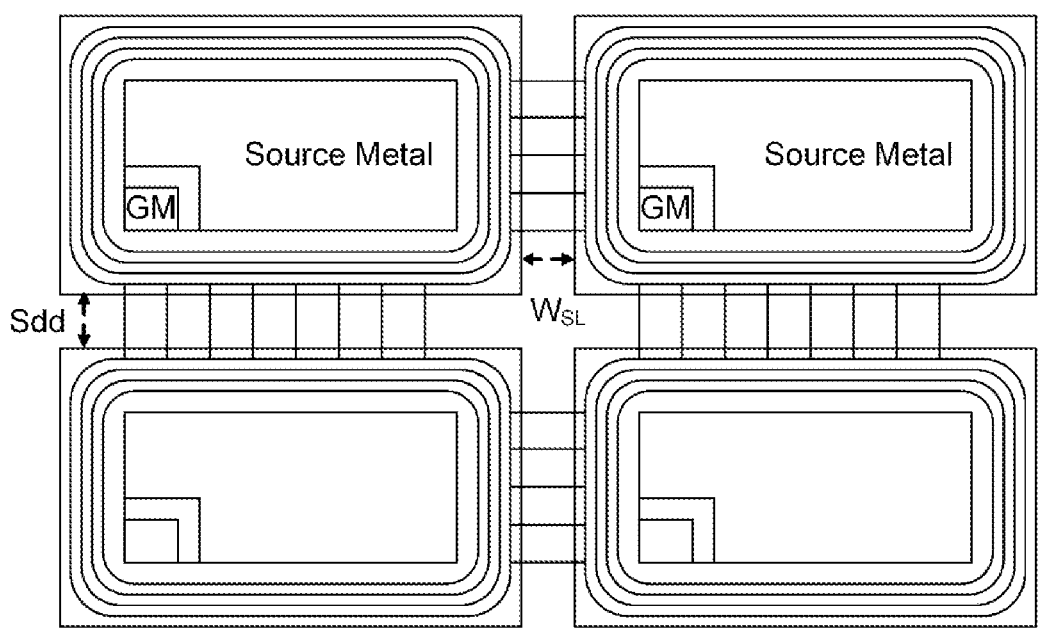
FIG. 3B is two dual dies layout of a preferred embodiment according to the present invention.

FIGS. 3A and 3B show two kinds of trench MOSFET layouts of a preferred embodiment according to the present invention. Since main die area and scribe line area are sometimes designed by different parties such as the main die area is designed by design house and the scribe line area is designed by foundry, the layout structures may not be feasibly achieved due to confidentiality issue. This invention further discloses a layout way to make it happen by design house only.

FIG. 3A shows a triple dies consisted of three dies each comprising a trench MOSFET with floating trenched gates (FTGs) and at least one channel stop trenched gate (CSTG) according to the present invention, wherein the three dies are connected together with multiple sawing trenched gates (SWTGs) in such a way that a die-to-die space ($S_{dd}$, as illustrated in FIG. 3B) between the two dies is as same as a scribe line width ($W_{SL}$, as illustrated in FIG. 3B).

Figure 4A:
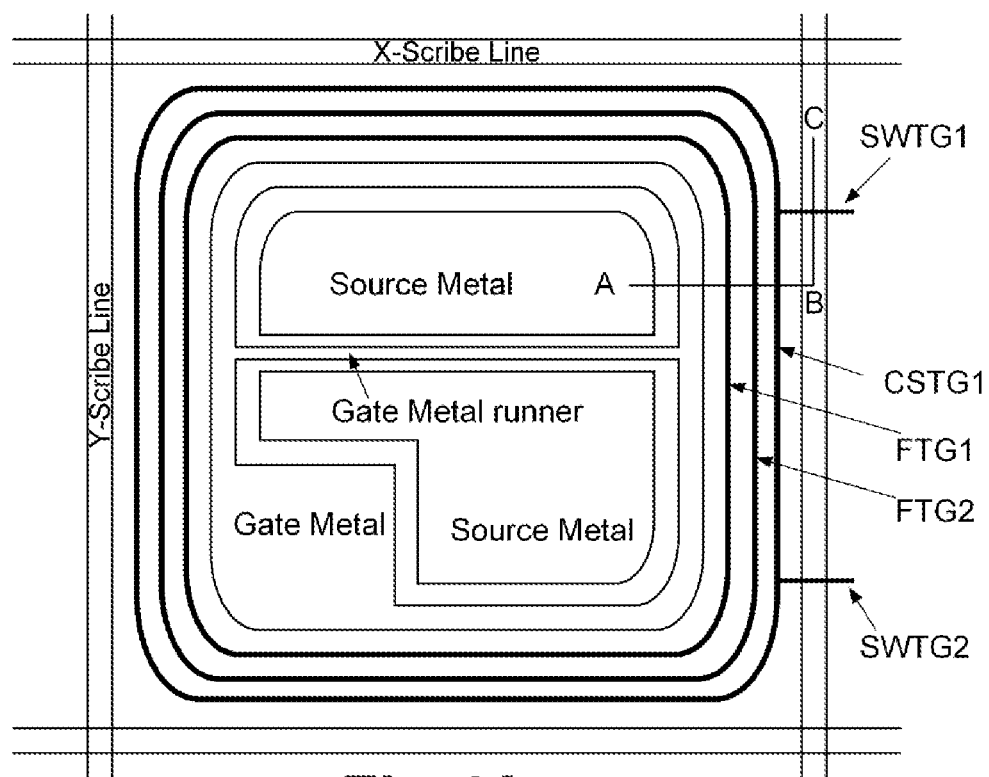
FIG. 4A is a top view of another preferred embodiment according to the present invention.

FIG. 4A is a top view of another preferred embodiment of the trench MOSFETs with shielded gate showing that the CSTG1 is acted as a trenched channel stop gate connecting to a SWTG1 (trenched gate to be sawed in scribe line) cross a scribe line (in Y direction). The SWTG1 is sawed to ensure the SWTG1 and TCSG1 are electrically shorted at scribe line to the drain region and body region (FIG. 2B).

Figure 4B:
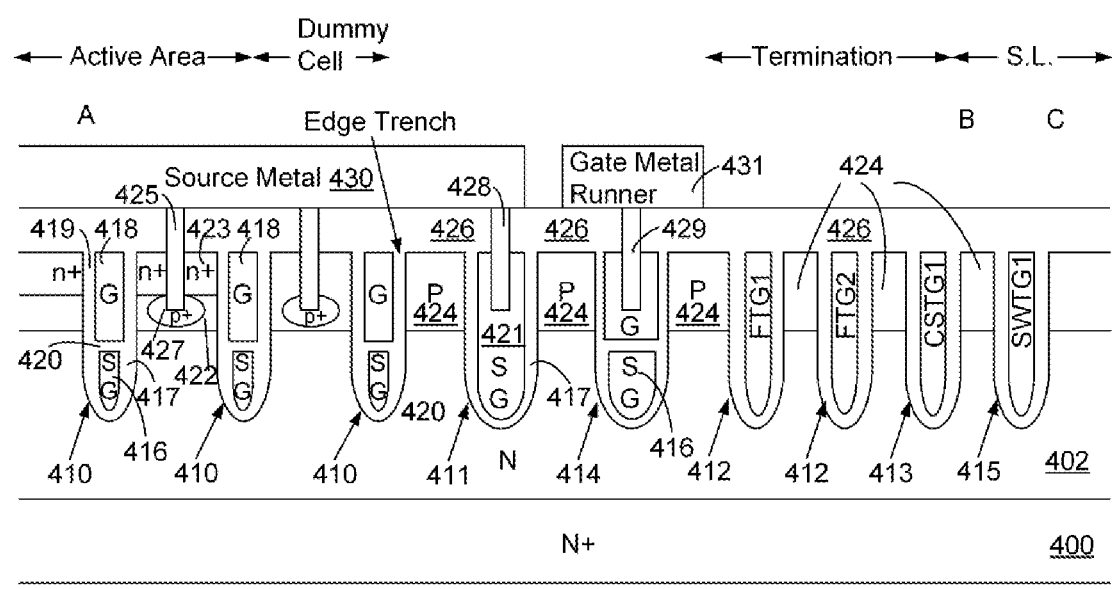
FIG. 4B is a cross-sectional view of the preferred embodiment shown in FIG. 4A.

Please refer to FIG. 4B for a preferred embodiment which is also a preferred A-B-C cross section of FIG. 4A, wherein an N-channel trench MOSFET is formed in an N epitaxial layer 402 onto an N+ substrate 400. Inside the N epitaxial layer 402, a plurality of shielded trenched gates 410 and at least one first type trenched gate 411 for shielded electrode contact are formed. At least one second type wide trenched gate 414 for gate contact is formed underneath the gate metal, multiple floating trenched gates (FTG) 412 and at least one channel stop trenched gate (CSTG) 413 are formed in the termination, and at least one sawing trenched gate (SWTG) 415 is formed cross a scribe line (S.L.). Among those trenched gates according to this embodiment, the shielded trenched gates 410 and the second type wide trenched gate 414 are each implemented by comprising a shielded electrode 416 padded by a first type gate oxide 417 in a lower portion and a gate electrode 418 padded by a second type gate oxide 419 in an upper portion, wherein the gate electrode 418 and the shielded electrode 416 are insulated from each other by an inter-electrode insulation layer 420. Meanwhile, the other trenched gates are each implemented by comprising a single shielded electrode 421 padded by the first type gate oxide 417. In an upper portion of the N epitaxial layer 402, a plurality of first type P body regions 422 having n+ source regions 423 whereon are extending between two adjacent of the gate electrodes 418 in the active area; and a plurality of second type P body regions 424 without having source regions whereon are formed around outside of the active area including the termination area. What should be noticed is that, the multiple floating trenched gates 412, 413 and 415 each has trench depth equal to or deeper than junction depth of the second type P body regions 424 to maintain breakdown voltage while preventing heavy leakage current. The N-channel trench MOSFET further comprises: a plurality of trenched source-body contacts each filled with a metal plug 425, penetrating through an insulation layer 426, the n+ source regions 423 and extending into the first type P body regions 422, wherein the meal plug 425 is surrounded by a p+ body contact region 427 around its bottom to further reduce the contact resistance; at least a trenched shielded electrode contact filled with a metal pug 428, penetrating through the insulation layer 426 and extending into the single shielded electrode 421 in the first type wider trenched gate 411; at least a trenched gate electrode contact filled with a metal pug 429, penetrating through the insulation layer 426 and extending into the gate electrode 416 in the second type wider trenched gate 414. The N-channel trench MOSFET further comprises a source metal pad 430 and a gate metal runner 431 connecting to the gate metal pad, the source metal pad 430 is connected to the n+ source regions 423, the first type P body regions 422 via the metal plug 425 filled in the trenched source-body contact, and is also connected to the shielded electrodes via the metal plug 428 filled in the trenched shielded electrode contact, the gate metal runner 431 is connected to the gate electrode 416 in the at least one second type wider trenched gate 414 via the metal plug 429 filled in the trenched gate contact for gate contact, wherein each of the metal plugs 425, 428 and 429 can be implemented by using a tungsten metal plug padded by a barrier layer of Ti/TiN or Co/TiN or Ta/TiN. Meanwhile, the at least one channel stop trenched gate 413 is connecting to the at least one sawing trenched gate 415, wherein the sawing trenched gate 415 is sawed in the Y-scribe line to ensure that the sawing trenched gate 415 and the channel stop trenched gate 413 are both electrically shorted to the N epitaxial layer 402 and to the second type body regions 424 surrounding the sawing trenched gate 415. Besides, the multiple trenched floating gates 412 and the second type P body regions 424 all have floating voltage. At least one dummy cell is formed around edge of the active area to enhance the avalanche capability of semiconductor devices, with the second type P body regions 424 but without having the n+ source regions surrounding trenched body contacts.

Figure 4C:
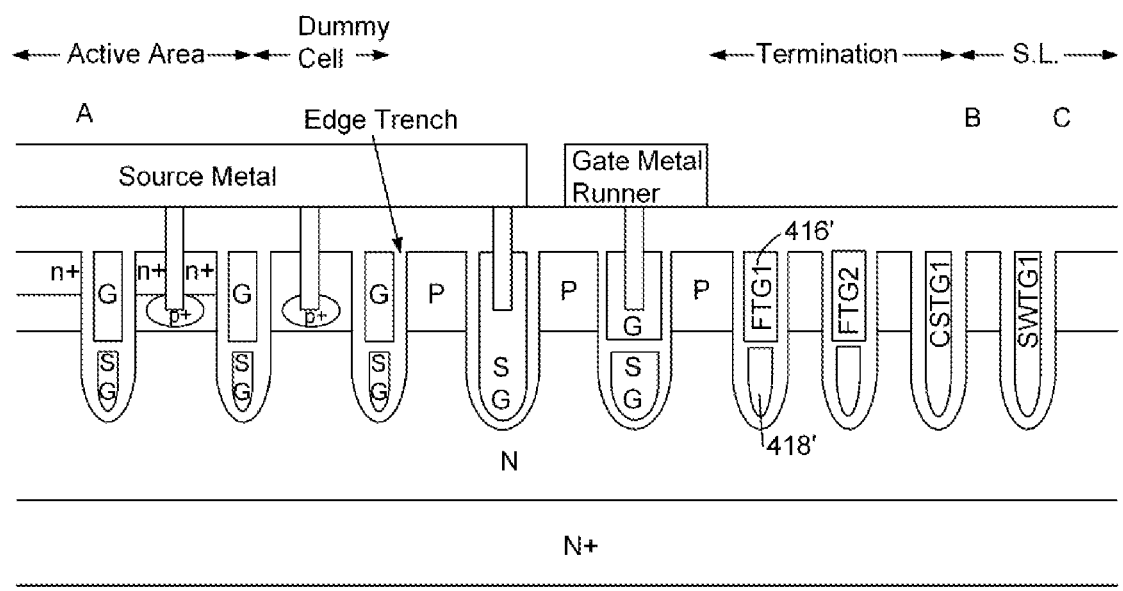
FIG. 4C is a cross-sectional view of another preferred embodiment according to the present invention.

Please refer to FIG. 4C for another preferred A-B-C cross section of trench semiconductor power MOSFET, which is similar to the invention illustrated in FIG. 4B, except that in FIG. 4C, FTGs in the termination area are different. FTGs in FIG. 4B are single shielded electrodes, while that in FIG. 4C comprises a shielded electrode 416' and a gate electrode 418'.

Figure 4D:
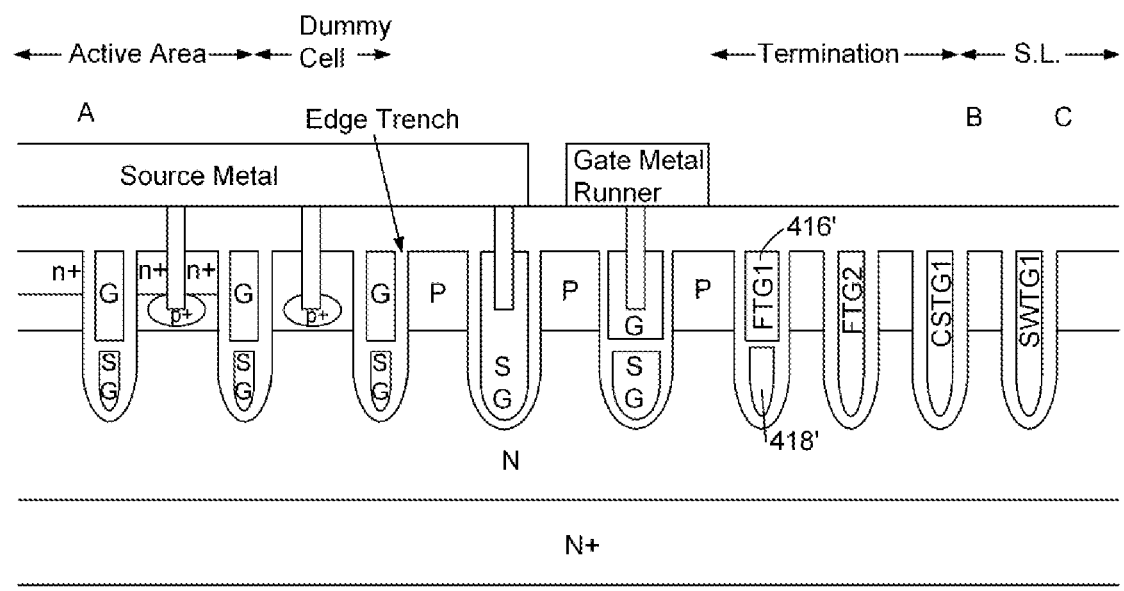
FIG. 4D is a cross-sectional view of another preferred embodiment according to the present invention.

Please refer to FIG. 4D for another preferred A-B-C cross section of trench semiconductor power MOSFET, which is similar to the invention illustrated in FIG. 4B, except that in FIG. 4D, FTG1 in the termination area is different. FTG1 in FIG. 4B is a single shielded electrode, while that in FIG. 4D comprises a shielded electrode 416' and a gate electrode 418'.

Figure 4E:
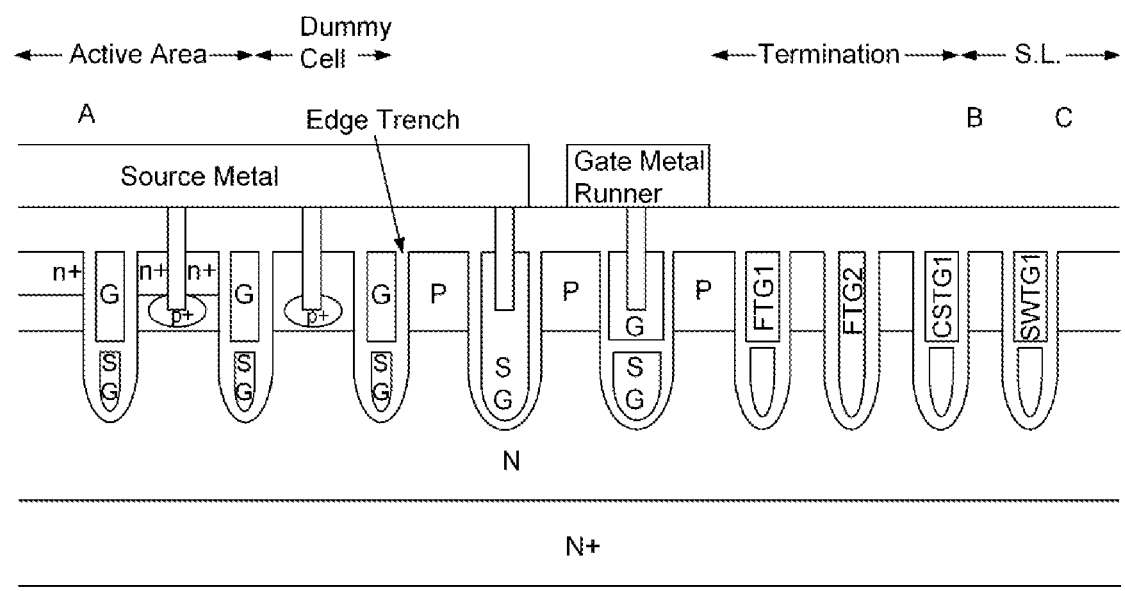
FIG. 4E is a cross-sectional view of another preferred embodiment according to the present invention.

Please refer to FIG. 4E for another preferred A-B-C cross section of trench semiconductor power MOSFET, which is similar to the invention illustrated in FIG. 4B, except that in FIG. 4E, FTG1, CSTG1 and SWTG1 in the termination area are different. FTG1, CSTG1 and SWTG1 in FIG. 4B are all single shielded electrodes, while that in FIG. 4D each comprises a shielded electrode and a gate electrode.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A semiconductor power device layout consisted of multiple trench MOSFETs wherein each of said multiple trench MOSFETs comprising:
   a substrate of a first conductivity type;
   an epitaxial layer of said first conductivity type grown on said substrate, wherein said epitaxial layer having a lower doping concentration than said substrate;
   a plurality of said source regions of said first conductivity type formed near top surface of said epitaxial layer only within said active area;
   a plurality of first type body regions of a second conductivity type formed underneath said source regions in said active area;
   a plurality of second type body regions of a second conductivity type formed in said epitaxial layer from top surface of said epitaxial layer around outside of said active area including said termination area;
   said source regions being not disposed in the top of said second type body regions;
   multiple trenched floating gates formed in parallel in a termination area around outside of an active area, said multiple trenched floating gates having floating voltage and surrounded by body regions without having source regions, said multiple trenched floating gates having trench depth equal to or deeper than body junction of said body regions;
   at least one channel stop trenched gate formed in said termination area and around outside of said multiple floating trenched gates, each said trenched channel top gate being connected to at least one sawing trenched gate, each said sawing trenched gate being extended across over a space and connected with said trenched channel stop gate of adjacent trench MOSFETs;
   at least one dummy cell formed between an edge trench and said active area, having said body region and trenched source-body contact but without having said source region;
   a plurality of shielded trenched gates in said active area, wherein each said shielded trenched gate having dual gate electrodes comprising a gate electrode disposed in the upper portion and a shielded electrode disposed in the lower potion, wherein said gate electrode and said shielded electrode insulated from each other by an inter-electrode insulation layer;
   said gate electrode in said shielded trenched gates connected to a gate metal formed over said insulation layer and said shielded electrode in said shielded trenched gates connected to a source metal formed over said insulation layer;
   each said shielded trenched gate in said active area further comprises a first type gate oxide layer surrounding bottom and sidewalls of said shielded electrode, and a second type gate oxide along sidewalls of said gate electrode; and
   a drain metal on rear side of said substrate.

2. The semiconductor power device layout of claim 1 wherein said space between two said adjacent trench MOSFETS of said multiple trench MOSFETs has a width same as scribe line.

3. The semiconductor power device layout of claim 1 wherein said channel stop trenched gate and said sawing trenched gate of each of said multiple trench MOSFETs are shorted with a drain region of said multiple trench MOSFETs after die sawing through said sawing trenched gate for separation of said multiple trench MOSFETs.

4. The semiconductor power device layout of claim 1, wherein said second type body regions in said dummy cells adjacent to edge of said active area are connected to said source metal pad.

5. The semiconductor power device layout of claim 1, wherein there is only one said channel stop trenched gate formed in each of said multiple trench MOSFETs and connected to at least one said sawing trenched gate.

6. The semiconductor power device of claim 1, wherein each of said multiple floating trenched gates in said termination area comprises a single shielded electrode having same conductive material as said shielded electrode in said shielded trenched gates in said active area, padded by said first type gate oxide layer.

7. The semiconductor power device of claim 1, wherein said channel stop trenched gate has a single shielded electrode padded by said first type gate oxide layer.

8. The semiconductor power device of claim 1, wherein said channel stop trenched gate has said dual gate electrodes same as in active area.

9. The semiconductor power device of claim 1, wherein said sawing trenched gate has a single shielded electrode padded by said first type gate oxide layer.

10. The semiconductor power device of claim 1, wherein said sawing trenched gate has said dual gate electrodes same as in active area.

11. The semiconductor power device of claim 1, wherein said multiple floating trenched gates in said termination area have same trench width and depth as said shielded trenched gates in said active area.

12. The semiconductor power device of claim 1, wherein said multiple floating trenched gates in said termination area have greater trench width and depth than said shielded trenched gates in said active area.

13. The semiconductor power device of claim 1, wherein said first type gate oxide has oxide thickness greater than said second type gate oxide.

14. The semiconductor power device of claim 1, wherein said first conductivity type is N type and said second conductivity type is P type.

15. The semiconductor power device of claim 1, wherein said first conductivity type is P type and said second conductivity type is N type.

16. The semiconductor power device of claim 1, wherein each said source region in said active area has uniform doping concentration and junction depth along the top surface of said epitaxial layer.

17. A semiconductor power device layout consisted of multiple trench MOSFETs wherein each of said multiple trench MOSFETs comprising:
- a substrate of a first conductivity type;
- an epitaxial layer of said first conductivity type grown on said substrate, wherein said epitaxial layer having a lower doping concentration than said substrate;
- a plurality of said source regions of said first conductivity type formed near top surface of said epitaxial layer only within said active area;
- a plurality of first type body regions of a second conductivity type formed underneath said source regions in said active area;
- a plurality of second type body regions of a second conductivity type formed in said epitaxial layer from top surface of said epitaxial layer around outside of said active area including said termination area;
- said source regions being not disposed in the top of said second type body regions;
- multiple trenched floating gates formed in parallel in a termination area around outside of an active area, said multiple trenched floating gates having floating voltage and surrounded by body regions without having source regions, said multiple trenched floating gates having trench depth equal to or deeper than body junction of said body regions;
- at least one channel stop trenched gate formed in said termination area and around outside of said multiple floating trenched gates, each said trenched channel top gate being connected to at least one sawing trenched gate, each said sawing trenched gate being extended across over a space and connected with said trenched channel stop gate of adjacent trench MOSFETs; and
- at least one dummy cell formed between an edge trench and said active area, having said body region and trenched source-body contact but without having said source region;
- a plurality of shielded trenched gates in said active area, wherein each said shielded trenched gate having dual gate electrodes comprising a gate electrode disposed in the upper portion and a shielded electrode disposed in the lower potion, wherein said gate electrode and said shielded electrode insulated from each other by an inter-electrode insulation layer;
- said gate electrode in said shielded trenched gates connected to a gate metal formed over said insulation layer and said shielded electrode in said shielded trenched gates connected to a source metal formed over said insulation layer;
- each said shielded trenched gate in said active area further comprises a first type gate oxide layer surrounding bottom and sidewalls of said shielded electrode, and a second type gate oxide along sidewalls of said gate electrode;
- a drain metal on rear side of said substrate; and
- wherein each of said multiple floating trenched gates in said termination area has said dual gate electrodes same as in active area.

18. A semiconductor power device layout consisted of multiple trench MOSFETs wherein each of said multiple trench MOSFETs comprising:
- a substrate of a first conductivity type;
- an epitaxial layer of said first conductivity type grown on said substrate, wherein said epitaxial layer having a lower doping concentration than said substrate;
- a plurality of said source regions of said first conductivity type formed near top surface of said epitaxial layer only within said active area;
- a plurality of first type body regions of a second conductivity type formed underneath said source regions in said active area;
- a plurality of second type body regions of a second conductivity type formed in said epitaxial layer from top surface of said epitaxial layer around outside of said active area including said termination area;
- said source regions being not disposed in the top of said second type body regions;
- multiple trenched floating gates formed in parallel in a termination area around outside of an active area, said multiple trenched floating gates having floating voltage and surrounded by body regions without having source regions, said multiple trenched floating gates having trench depth equal to or deeper than body junction of said body regions;
- at least one channel stop trenched gate formed in said termination area and around outside of said multiple floating trenched gates, each said trenched channel top gate being connected to at least one sawing trenched gate, each said sawing trenched gate being extended across over a space and connected with said trenched channel stop gate of adjacent trench MOSFETs; and
- at least one dummy cell formed between an edge trench and said active area, having said body region and trenched source-body contact but without having said source region;
- a plurality of shielded trenched gates in said active area, wherein each said shielded trenched gate having dual gate electrodes comprising a gate electrode disposed in the upper portion and a shielded electrode disposed in the lower potion, wherein said gate electrode and said shielded electrode insulated from each other by an inter-electrode insulation layer;
- said gate electrode in said shielded trenched gates connected to a gate metal formed over said insulation layer and said shielded electrode in said shielded trenched gates connected to a source metal formed over said insulation layer;
- each said shielded trenched gate in said active area further comprises a first type gate oxide layer surrounding bottom and sidewalls of said shielded electrode, and a second type gate oxide along sidewalls of said gate electrode;
- a drain metal on rear side of said substrate; and
- wherein said multiple floating trenched gates in said termination have combination structure of a single shielded electrode padded by said first type gate oxide layer, and said dual gate electrodes same as in said active area.

* * * * *